US008912043B2

(12) United States Patent
Chandrasekaran et al.

(10) Patent No.: US 8,912,043 B2
(45) Date of Patent: Dec. 16, 2014

(54) DUAL-SIDE INTERCONNECTED CMOS FOR STACKED INTEGRATED CIRCUITS

(71) Applicant: QUALCOMM Incorporated, San Diego, CA (US)

(72) Inventors: Arvind Chandrasekaran, Los Angeles, CA (US); Brian Matthew Henderson, Escondido, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/945,722

(22) Filed: Jul. 18, 2013

(65) Prior Publication Data

US 2013/0302943 A1      Nov. 14, 2013

Related U.S. Application Data

(62) Division of application No. 12/758,164, filed on Apr. 12, 2010, now Pat. No. 8,525,342.

(51) Int. Cl.
| | |
|---|---|
| *H01L 21/00* | (2006.01) |
| *H01L 25/065* | (2006.01) |
| *H01L 21/50* | (2006.01) |
| *H01L 23/48* | (2006.01) |
| *H01L 25/18* | (2006.01) |
| *H01L 23/00* | (2006.01) |
| *H01L 23/525* | (2006.01) |

(52) U.S. Cl.
CPC ............... *H01L 21/50* (2013.01); *H01L 23/525* (2013.01); *H01L 2224/06181* (2013.01); *H01L 2225/06513* (2013.01); *H01L 25/0657* (2013.01); *H01L 2924/01029* (2013.01); *H01L 2225/06541* (2013.01); *H01L 23/481* (2013.01); *H01L 25/18* (2013.01); *H01L 24/94* (2013.01)
USPC .................................. 438/109; 257/E21.503

(58) Field of Classification Search
USPC ........................... 438/465, 977; 257/E21.569
See application file for complete search history.

(56) References Cited

U.S. PATENT DOCUMENTS

| | | | |
|---|---|---|---|
| 5,920,094 | A | 7/1999 | Nam |
| 6,159,780 | A | 12/2000 | Nam |

(Continued)

FOREIGN PATENT DOCUMENTS

| | | |
|---|---|---|
| CN | 1770454 A | 5/2006 |
| JP | 2002208655 A | 7/2002 |

(Continued)

OTHER PUBLICATIONS

C. Keast, et al., "Three-Dimensional Integration Technology for Advanced Focal Planes", Lincoln Laboratory, Massachusetts Institute of Technology, Lexington, pp. 204-206.

(Continued)

*Primary Examiner* — Chandra Chaudhari
(74) *Attorney, Agent, or Firm* — Michelle S. Gallardo

(57) ABSTRACT

A stacked integrated circuit (IC) may be manufactured with a second tier wafer bonded to a double-sided first tier wafer. The double-sided first tier wafer includes back-end-of-line (BEOL) layers on a front and a back side of the wafer. Extended contacts within the first tier wafer connect the front side and the back side BEOL layers. The extended contact extends through a junction of the first tier wafer. The second tier wafer couples to the front side of the first tier wafer through the extended contacts. Additional contacts couple devices within the first tier wafer to the front side BEOL layers. When double-sided wafers are used in stacked ICs, the height of the stacked ICs may be reduced. The stacked ICs may include wafers of identical functions or wafers of different functions.

20 Claims, 11 Drawing Sheets

(56) References Cited

U.S. PATENT DOCUMENTS

| | | |
|---|---|---|
| 6,818,544 B2 * | 11/2004 | Eichelberger et al. ........ 438/613 |
| 7,354,798 B2 | 4/2008 | Pogge et al. |
| 7,456,094 B2 | 11/2008 | Ma et al. |
| 7,906,363 B2 | 3/2011 | Koyanagi |
| 7,930,664 B2 | 4/2011 | Feng et al. |
| 7,969,009 B2 | 6/2011 | Chandrasekaran |
| 8,525,342 B2 | 9/2013 | Chandrasekaran et al. |
| 2002/0109236 A1 | 8/2002 | Kim et al. |
| 2005/0167782 A1 | 8/2005 | Sanchez et al. |
| 2007/0216041 A1 | 9/2007 | Patti et al. |
| 2008/0179688 A1 | 7/2008 | Thei et al. |
| 2009/0057890 A1 | 3/2009 | Maebashi et al. |
| 2009/0061659 A1 | 3/2009 | Maebashi |
| 2009/0321939 A1 | 12/2009 | Chandrasekaran |
| 2009/0325350 A1 | 12/2009 | Radosavljevic et al. |
| 2010/0019390 A1 | 1/2010 | Jung |
| 2010/0081232 A1 | 4/2010 | Furman et al. |
| 2010/0314737 A1 | 12/2010 | Henderson et al. |
| 2011/0012239 A1 | 1/2011 | Gu et al. |
| 2011/0068433 A1 | 3/2011 | Kim et al. |
| 2011/0075393 A1 | 3/2011 | Chandrasekaran et al. |
| 2011/0193197 A1 | 8/2011 | Farooq et al. |
| 2011/0193211 A1 | 8/2011 | Chandrasekaran et al. |

FOREIGN PATENT DOCUMENTS

| | | |
|---|---|---|
| JP | 2002305283 A | 10/2002 |
| JP | 2003203914 A | 7/2003 |
| JP | 2004327910 A | 11/2004 |
| JP | 2007056769 A | 3/2007 |
| JP | 2007073775 A | 3/2007 |
| JP | 2009055007 A | 3/2009 |
| WO | 2007024022 A1 | 3/2007 |
| WO | WO-2010002645 A1 | 1/2010 |

OTHER PUBLICATIONS

International Search Report and Written Opinion—PCT/US2011/031386—ISA/EPO—Aug. 19, 2011.

V. F. Pavlidis, et al., "Interconnect-based design methodologies for three-dimensional integrated circuits," Proc. of the IEEE, 366 pages, 2008.

* cited by examiner

DUAL-SIDE INTERCONNECTED CMOS FOR STACKED INTEGRATED CIRCUITS

CROSS REFERENCE TO RELATED APPLICATION

This application is a divisional of co-pending U.S. patent application Ser. No. 12/758,164 filed Apr. 12, 2010, entitled "DUAL-SIDE INTERCONNECTED CMOS FOR STACKED INTEGRATED CIRCUITS," the disclosure of which is expressly incorporated by reference herein in its entirety.

TECHNICAL FIELD

The present disclosure generally relates to integrated circuits. More specifically, the present disclosure relates to packaging integrated circuits.

BACKGROUND

Stacked ICs increase device functionality and decrease occupied area by stacking dies vertically. In stacked ICs, a second die is stacked on a first die allowing construction to expand into three dimensions (3D). Stacked ICs allow products with a greater number of components to fit in small form factors. Component density of a semiconductor die is the number of components in the die divided by the die area. For example, stacking a die on an identical die results in approximately double the number of components in the same area to double component density. When a second die is stacked on a first die, the two dies share the same packaging and communicate to external devices through the packaging.

Dies may be stacked using several methods, including Package-on-Package (PoP) processes and through-silicon-stacking (TSS) processes. However, in some applications the height of the stacked IC is restricted. For example, ultra-thin cellular phones may not support stacked ICs having multiple dies. Thus, there is a need to reduce the thickness of stacked ICs.

BRIEF SUMMARY

According to one aspect of the disclosure, a stacked integrated circuit a first tier wafer. The stacked integrated circuit also includes a first extended contact extending through a junction in the first tier wafer for providing electrical connectivity through the first tier wafer. The stacked integrated circuit further includes a second tier wafer attached to the first tier wafer. The second tier wafer includes an electrical component electrically coupled to the first extended contact.

According to another aspect of the disclosure, a method of manufacturing a stacked integrated circuit includes thinning a first tier wafer to expose an extended contact extending through a junction of the first tier wafer. The extended contact being coupled to front side back-end-of-line layers. The method also includes depositing a dielectric on the first tier wafer after thinning the first tier wafer. The method further includes depositing back side back-end-of-line layers on the dielectric, the back side back-end-of line layers coupling to the extended contact. The method also includes bonding a second tier wafer to the first tier wafer after depositing the back side back-end-of-line layers so that circuitry on the second tier wafer is coupled to the front side back-end-of-line layers through the extended contact.

According to a further aspect of the disclosure, a method of manufacturing a stacked integrated circuit includes the steps of thinning a first tier wafer to expose a extended contact extending through at least one of a source region and a drain region of the first tier wafer. The extended contact being coupled to front side back-end-of-line layers. The method also includes the step of depositing a dielectric on the first tier wafer after thinning the first tier wafer. The method further includes the step of depositing back side back-end-of-line layers on the dielectric, the back side back-end-of line layers coupling to the extended contact. The method also includes the step of bonding a second tier wafer to the first tier wafer after depositing the back side back-end-of-line layers so that circuitry on the second tier wafer is coupled to the front side back-end-of-line layers through the extended contact.

According to another aspect of the disclosure, a sacked integrated circuit includes a first tier wafer having a first back-end-of-line layer on a front side and having a second back-end-of-line layer on a back side. The stacked integrated circuit also includes means for coupling the first back-end-of-line layer to the second back-end-of-line layer through a junction of the first tier wafer. The stacked integrated circuit further includes a first contact pad on the back side of the first tier wafer coupled to the second back-end-of-line layer. The stacked integrated circuit also includes a second tier wafer having a third a back-end-of-line layer on a front side. The stacked integrated circuit further includes a second contact pad on the front side of the second tier wafer coupled to the third back-end-of-line layer and coupled to the first contact pad. The coupling means couples the third back-end-of-line layer to the first back-end-of-line layer.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Reducing the height of stacked integrated circuits (ICs) may be accomplished with dual-side interconnected integrated circuits. According to one embodiment, a combination of regular contacts and extended contacts are etched in an integrated circuit. The regular contacts allow coupling to the front side of the integrated circuit, and the extended contacts allow coupling to the front side and back side of the integrated circuit. Dual-side integrated circuits allow construction of ultra-thin stacked integrated circuits. Additionally, very high density tier-to-tier connections in the stacked IC are made possible.

Figure 1:
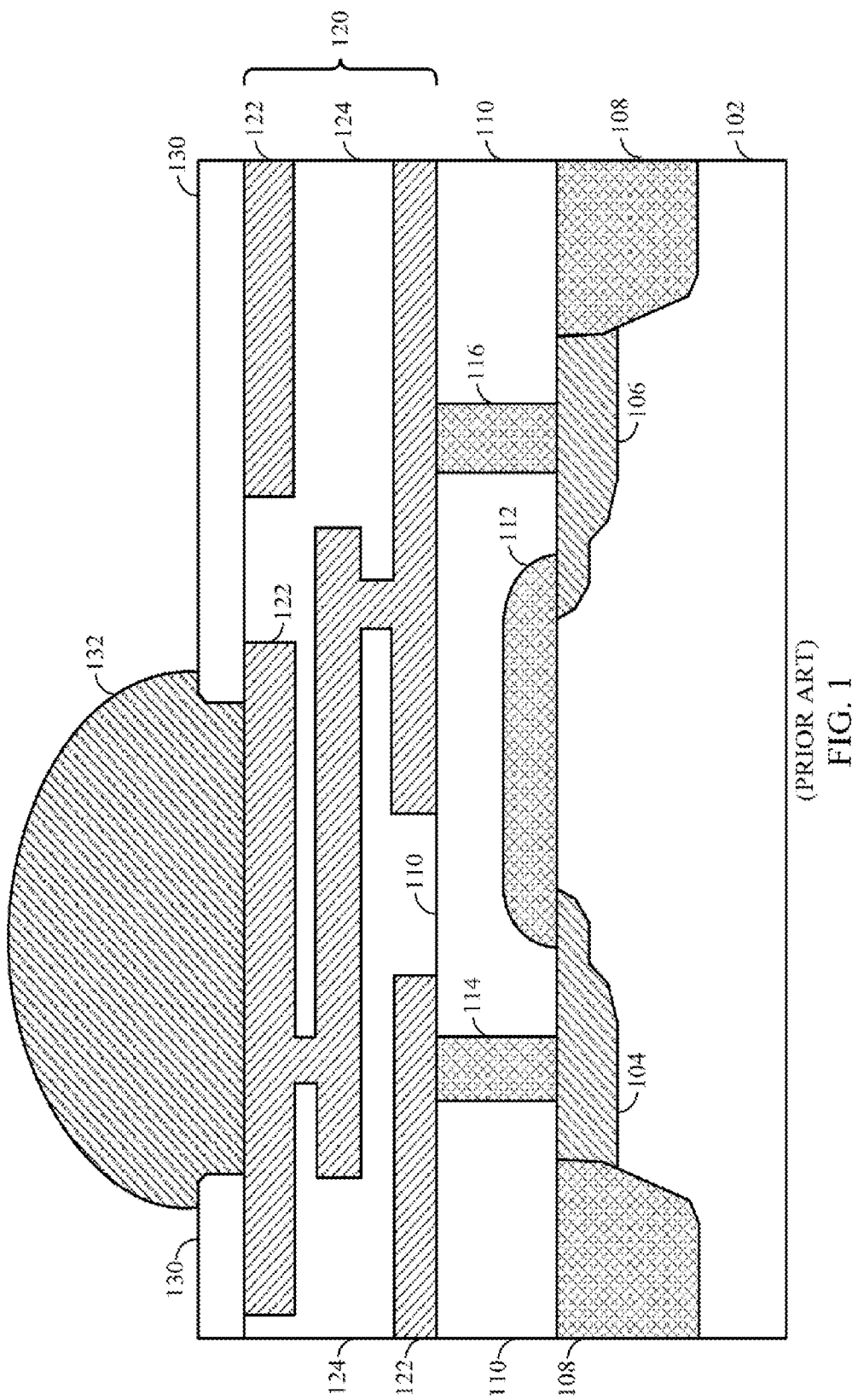
FIG. 1 is a cross-sectional view illustrating a conventional semiconductor die.

FIG. 1 is a cross-sectional view illustrating a conventional semiconductor die. A bulk semiconductor layer 102 such as silicon includes a source region 104 and a drain region 106. Trench isolation regions 108 isolate the regions 104, 106 from other regions in the bulk semiconductor layer 102. A gate structure 112 is formed between the regions 104, 106 and on the bulk semiconductor layer 102. A dielectric layer 110 is deposited on the bulk semiconductor layer 102 and the gate structure 112. Contacts 114, 116 extend through the dielectric layer 110 to the regions 104, 106, respectively. The contacts 114, 116 also couple to metal layers 122 in back-end-of-line (BEOL) layers 120. The BEOL layers 120 may also include a dielectric layer 124. A dielectric layer 130 is deposited on the BEOL layers 120 and a packaging structure 132 such as, for example, a flip-chip bump, couples to the metal layers 122.

Figure 2:
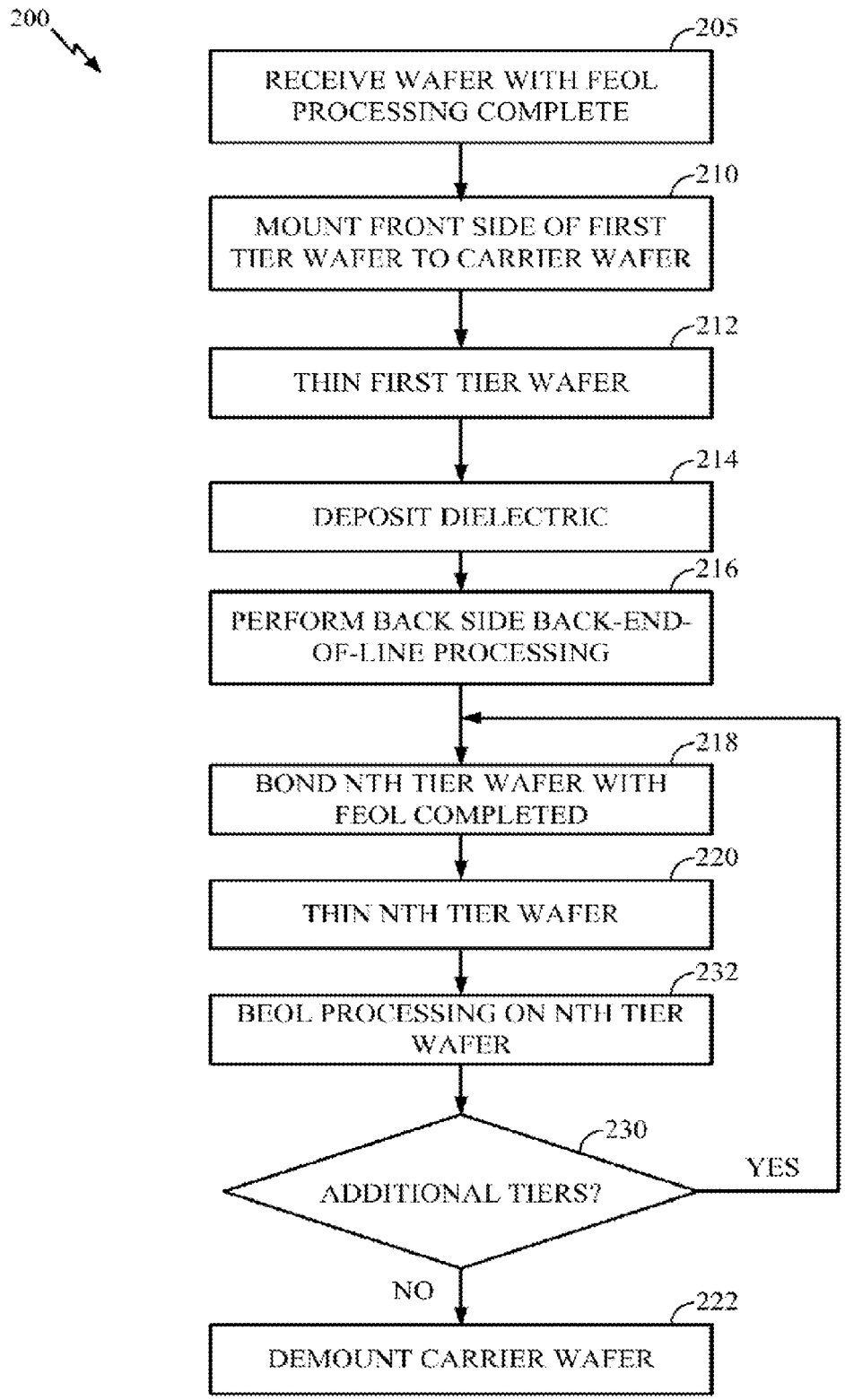
FIG. 2 is a flow chart illustrating an exemplary process for manufacturing dual-sided interconnected integrated circuits according to one embodiment.

FIG. 2 is a flow chart illustrating an exemplary process for manufacturing dual-sided interconnected integrated circuits according to one embodiment. An exemplary process 200 is illustrated with cross-sectional views of FIGS. 3A-G according to one embodiment.

Figure 3A:
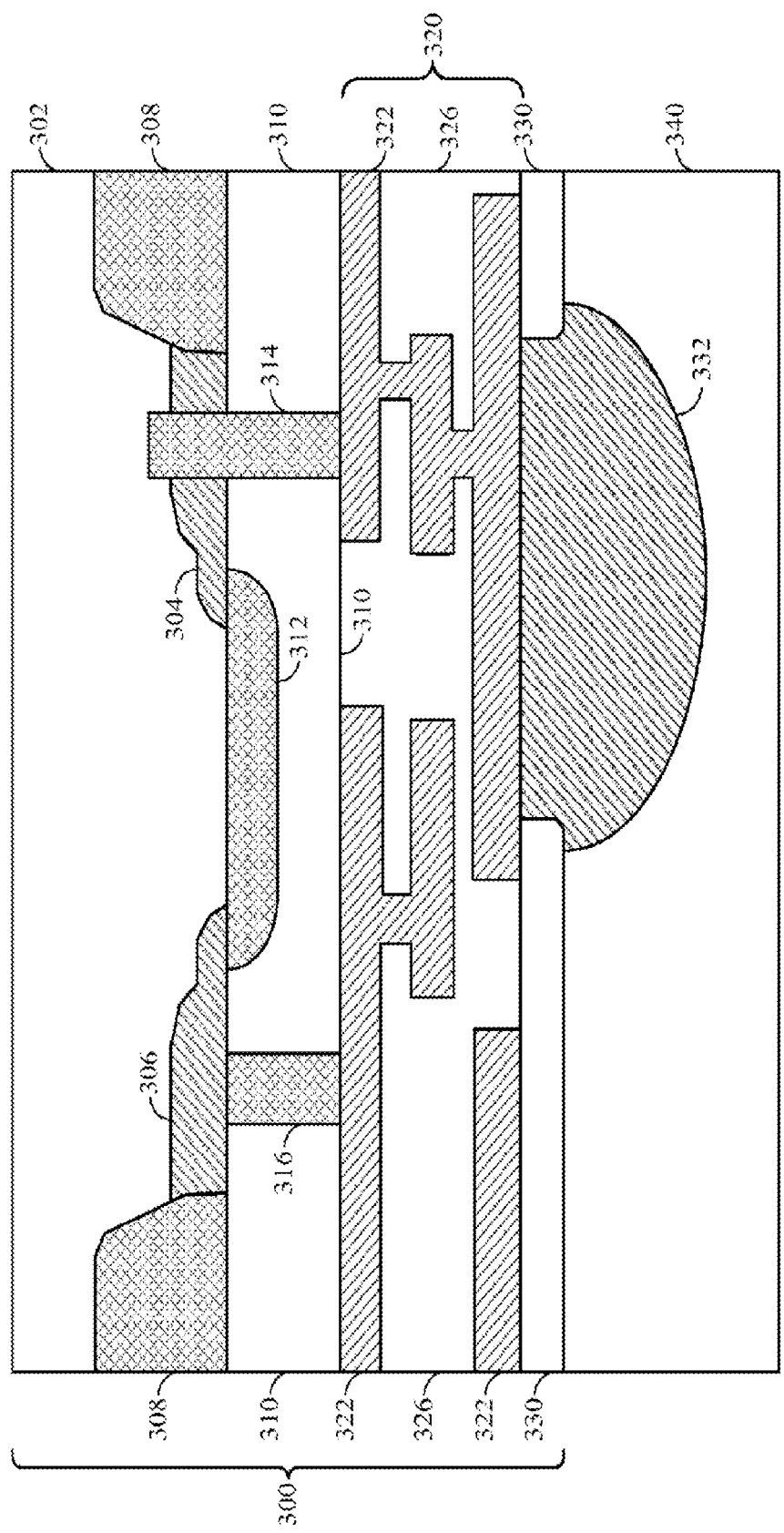
FIG. 3A-G are cross-sectional views illustrating an exemplary process for manufacturing dual-sided interconnected integrated circuits according to one embodiment.

The exemplary process 200 begins at block 205 with receiving a first tier wafer 300. The first tier wafer 300 may have front-end-of-line (FEOL) processing completed. The exemplary process 200 continues to block 210 with mounting a front side of the first tier wafer 300 to a carrier wafer 340. FIG. 3A is a cross-sectional view illustrating a first tier wafer mounted to the carrier wafer 340 according to one embodiment. The first tier wafer 300 includes a bulk semiconductor layer 302 having a source region 304 and a drain region 306. Trench isolation regions 308 isolate the regions 304, 306 from other regions in the bulk semiconductor layer 302. A gate structure 312 is formed between the regions 304, 306 and on the bulk semiconductor layer 302. A dielectric layer 310 is deposited on the bulk semiconductor layer 302 and the gate structure 312. A extended contact 314 and a contact 316 extend through the dielectric layer 310 to the regions 304, 306, respectively, forming junctions. According to one embodiment, the contacts 314, 316 are tungsten plugs. The contacts 314, 316 also couple to metal layers 322 in BEOL layers 320. In some embodiments, the extended contact 314 is formed after formation of the regions 304, 306, and the gate structure 312. According to one embodiment, the extended contact 314 extends through at least one of the regions 304, 306. Although not shown in FIG. 3A, the junction may be in a diode.

Additionally, a barrier layer (not shown) may be present between the extended contact 314 and the regions 304, 306. The barrier layer reduces metal contamination between the extended contact 314 and the regions 304, 306. The BEOL layers 320 may also include a dielectric layer 326. A dielectric layer 330 is deposited on the BEOL layers 320 and a packaging structure 332 such as, for example, a flip-chip bump, couples to the metal layers 322. The carrier wafer 340 is mounted to the first tier wafer 300. The carrier wafer 340 provides support for the first tier wafer 300 during later processing.

Figure 3B:
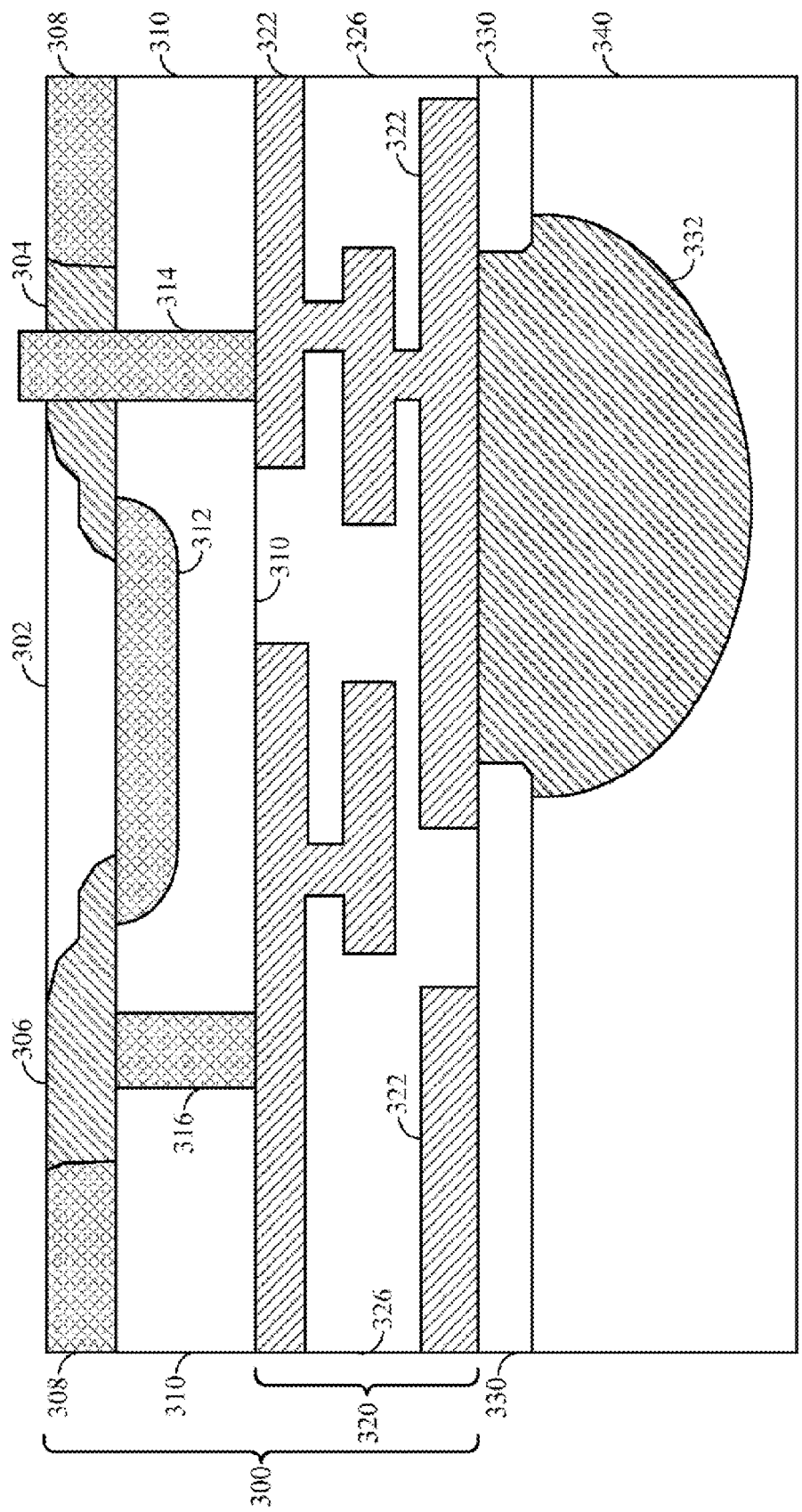

The exemplary process 200 continues to block 212 with thinning the first tier wafer 300. FIG. 3B is a cross-sectional view illustrating a first tier wafer after thinning according to one embodiment. The bulk semiconductor layer 302 of the first tier wafer 300 is thinned to expose region 304, region 306 and the extended contact 314. According to one embodiment, the thinning includes a recess etch.

Figure 3C:
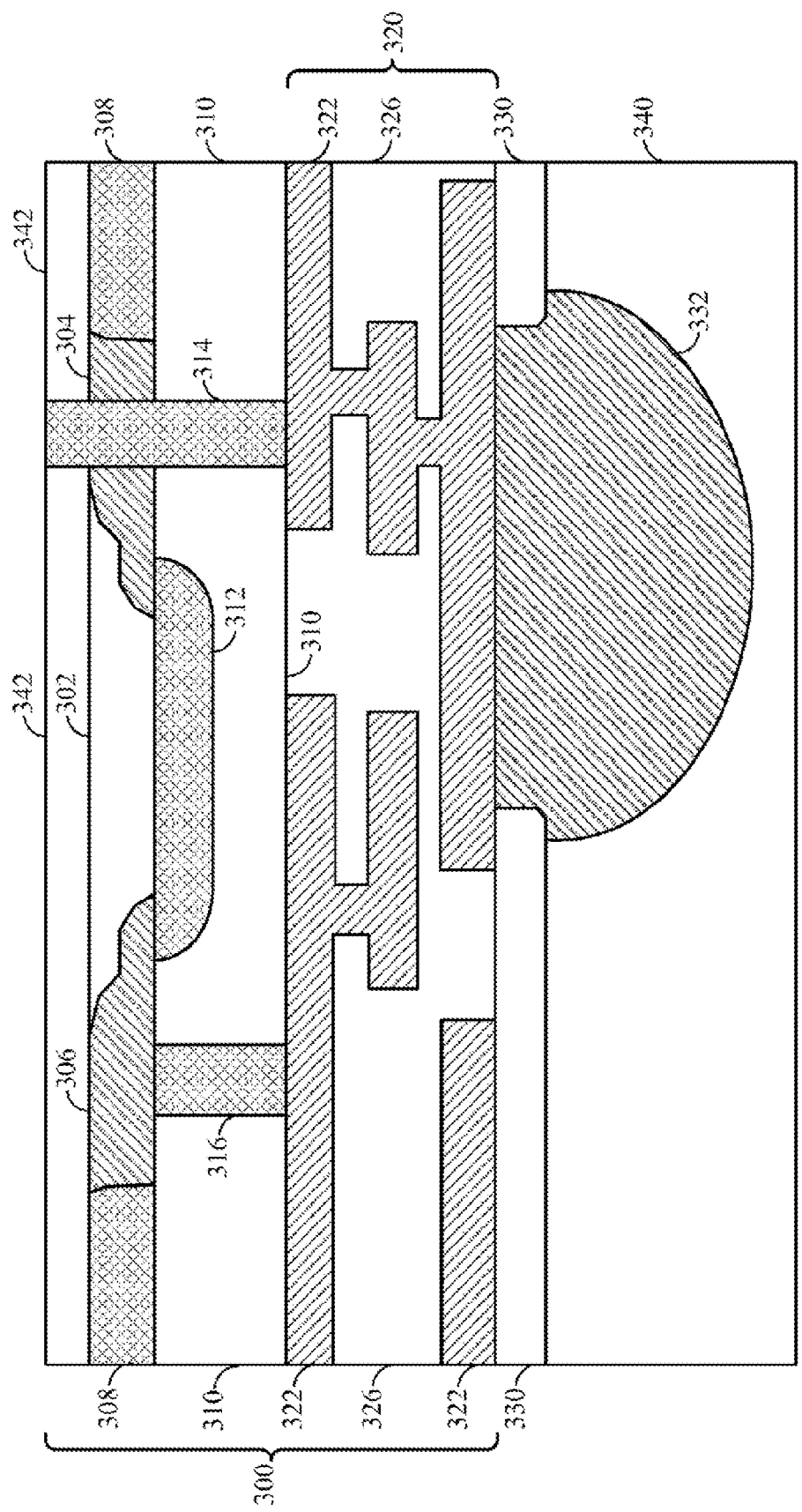

The exemplary process 200 continues to block 214 with depositing a dielectric layer 342 on the first tier wafer 300. FIG. 3C is a cross-sectional view illustrating a first tier wafer after dielectric deposition according to one embodiment. The dielectric layer 342 is deposited on the first tier wafer 300. The dielectric layer 342 may be, for example, silicon dioxide. According to one embodiment, a conformal dielectric layer 342 is deposited to cover the extended contact 314. In this embodiment, chemical mechanical polishing (CMP) etches the dielectric layer 342 to expose the extended contact 314 and to leave the dielectric layer 342 at a substantially similar level as the extended contact 314.

Figure 3D:
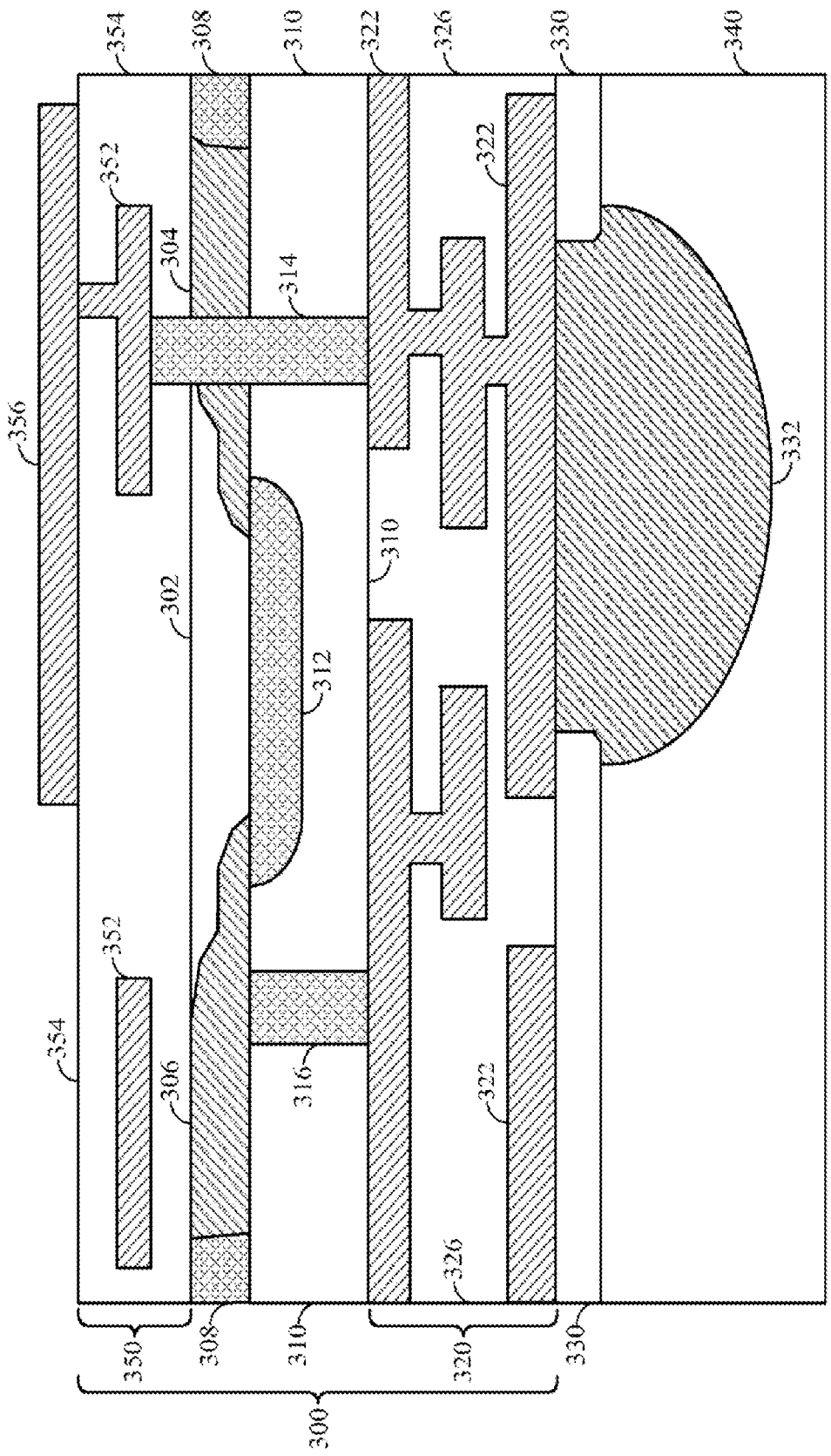

The exemplary process 200 continues to block 216 with back side BEOL processing. FIG. 3D is a cross-sectional view illustrating a first tier wafer after BEOL processing according to one embodiment. During BEOL processing BEOL layers 350, including a dielectric layer 354, metal layers 352, and contact pad 356, are deposited on the first tier wafer 300. According to one embodiment, microbumping is also performed on the first tier wafer 300 as part of the BEOL processing. The first tier wafer 300 is two-sided because BEOL layers 320, 350 are located on the front and back side of the first tier wafer 300, respectively.

Figure 3E:
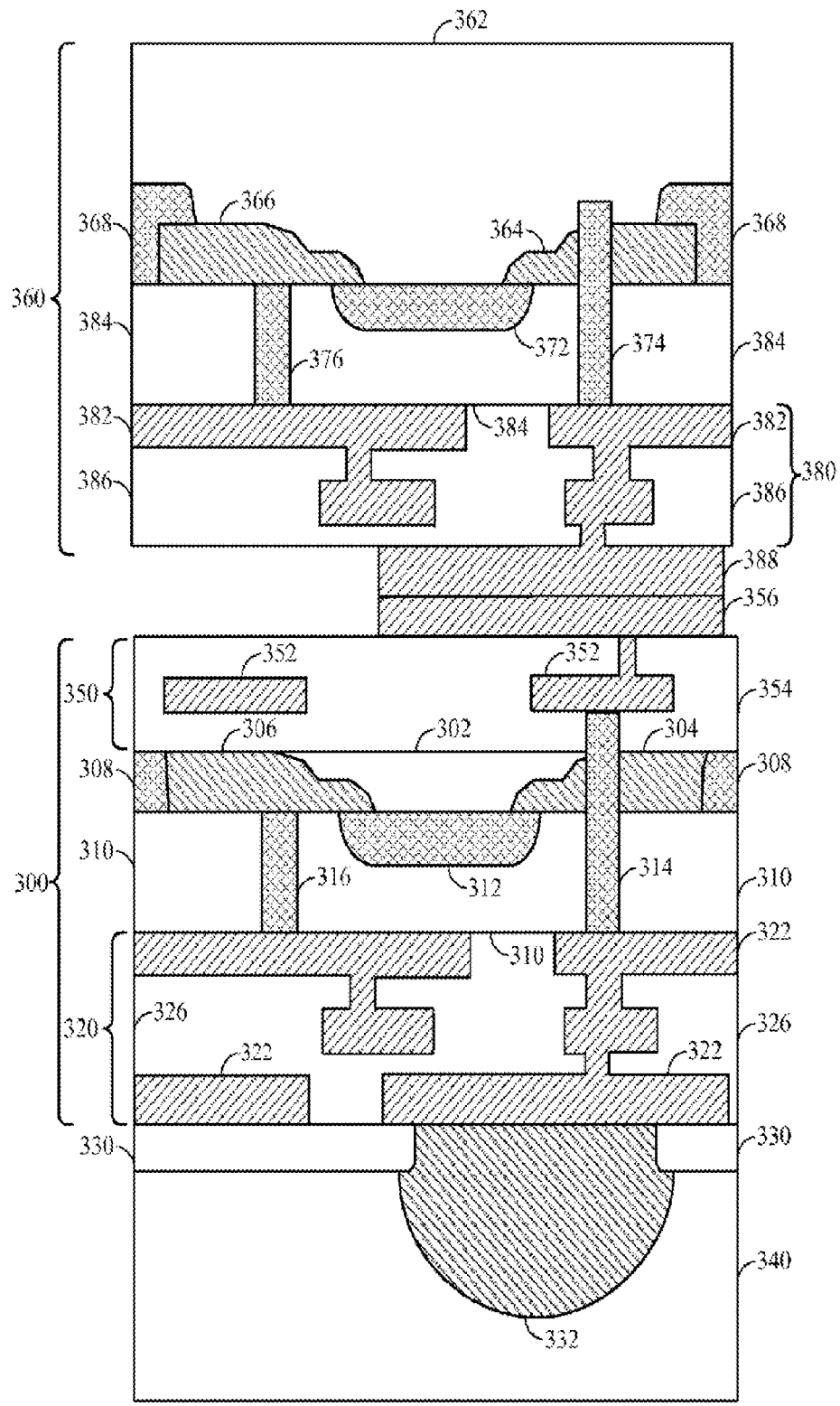

The exemplary process 200 continues to block 218 with bonding a second tier wafer 360 to the first tier wafer 300. FIG. 3E is a cross-sectional view illustrating a first tier wafer bonded to a second tier wafer according to one embodiment. The second tier wafer 360 includes a bulk semiconductor layer 362 having a source region 364 and a drain region 366. A gate structure 372 is located on the bulk semiconductor layer 362 between the regions 364, 366. Trench isolation regions 368 separate the regions 364, 366 from other source and drain regions (not shown) in the bulk semiconductor layer 362. A dielectric layer 384 is deposited on the bulk semiconductor layer 362 and the gate structure 372. An extended contact 374 and a regular contact 376 extend through the dielectric layer 384 to the regions 364, 366, respectively. BEOL layers 380 include metal layers 382 and a dielectric layer 386. Additionally, a contact pad 388 couples to the metal layers 382.

The second tier wafer 360 couples to the first tier wafer 300 through the contact pad 388 of the second tier wafer 360 and the contact pad 356 of the first tier wafer 300. According to one embodiment, the first tier wafer 300 is coupled to the second tier wafer 360 through copper-copper bonding.

Figure 3F:
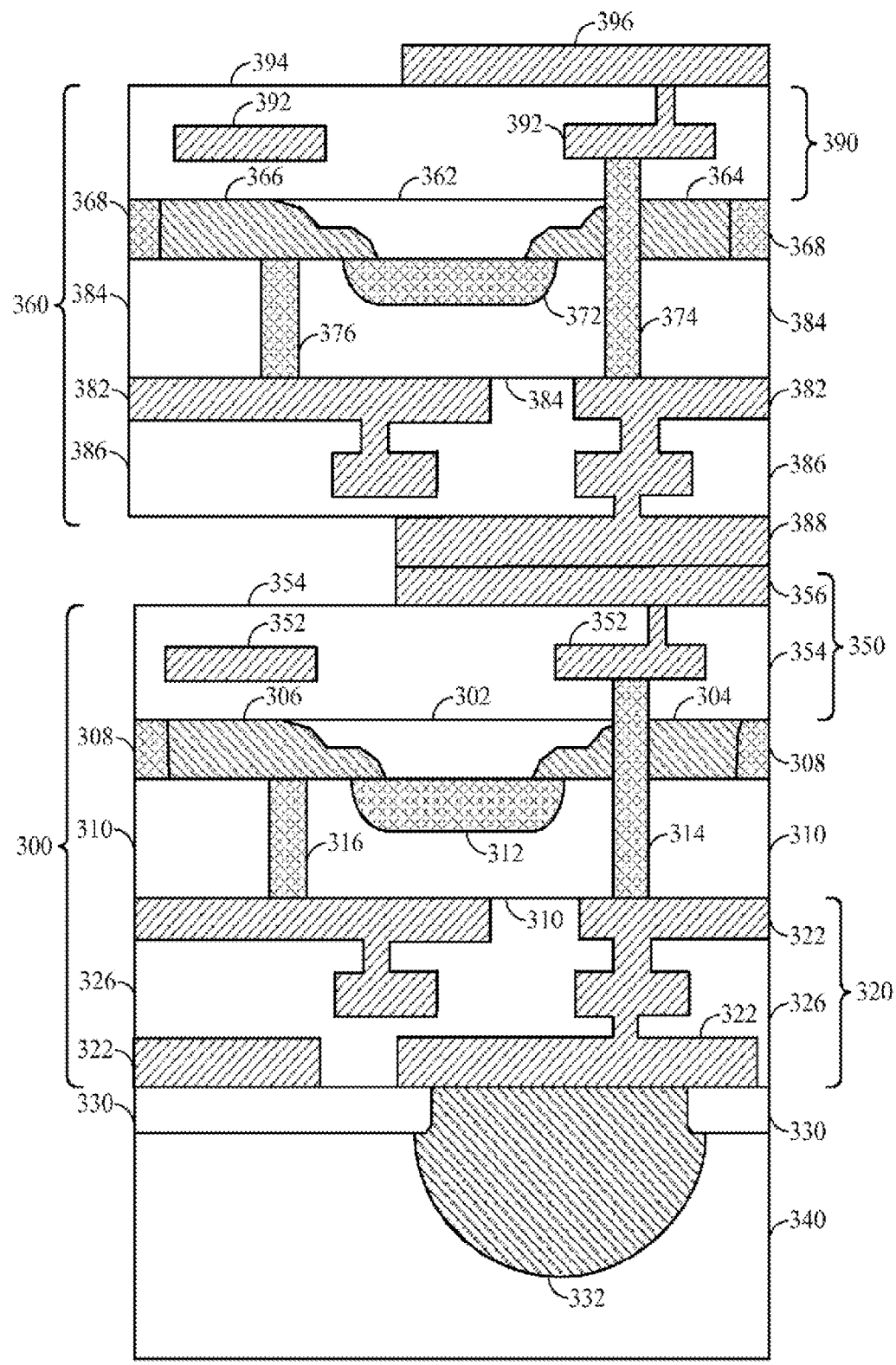

The exemplary process 200 continues to block 220 with thinning the second tier wafer 360. FIG. 3F is a cross-sectional view illustrating a stacked integrated circuit after thinning of the second tier wafer according to one embodiment. The bulk semiconductor layer 362 of the second tier wafer 360 is thinned to expose the extended contact 374.

After thinning the second tier wafer 360 at block 220, the exemplary process continues to block 232 to perform BEOL processing on the second tier wafer 360. Referring again to FIG. 3F, BEOL layers 390 are deposited on the second tier wafer 360 including a dielectric layer 394 and metal layers 392, and a contact pad 396 is coupled to the metal layers 392. According to one embodiment, the BEOL layers 390 and the contact pad 396 are not deposited on the second tier wafer 360 if no additional tiers will be stacked on the second tier wafer 360.

The exemplary process 200 continues to decision block 230 to determine if additional tiers are to be stacked in the stacked IC. If additional tiers exist, the exemplary process 200 continues to block 218 for an nth tier (e.g., third tier). If no additional tiers exist, the exemplary process 200 continues to block 222.

Figure 3G:
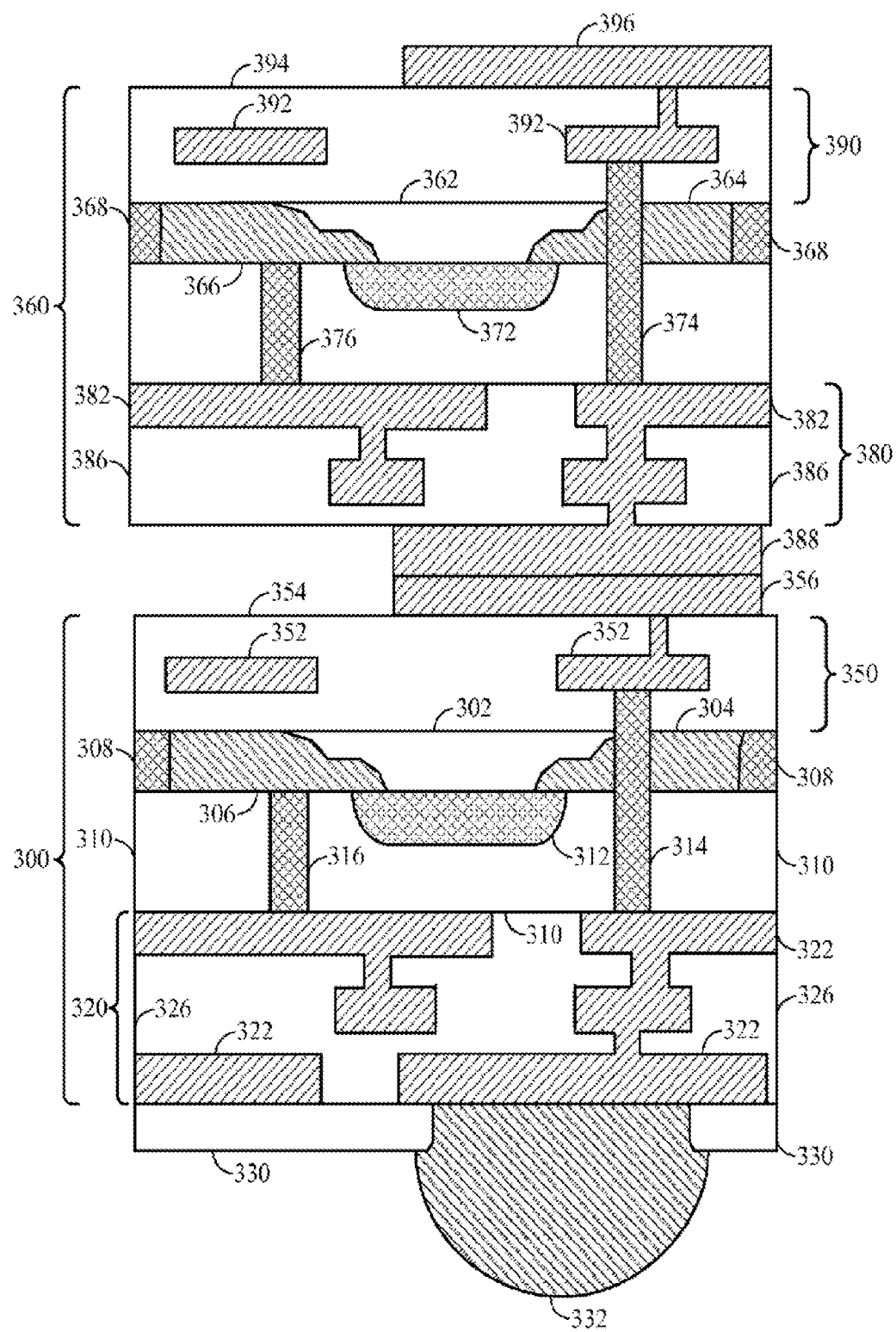

At block 222 of the exemplary process 200, the first tier wafer 300 is demounted from the carrier wafer 340. FIG. 3G is a cross-sectional view illustrating a stacked integrated circuit after demounting of the carrier wafer according to one embodiment. After demounting, the packaging structure 332 is exposed for further processing.

Although the exemplary process 200 is illustrated with wafers, the exemplary process 200 may also be performed when stacking dies. For example, after a first tier wafer is bonded to a carrier wafer, the second, third, or nth tier may be a wafer or a die.

The exemplary process for stacking integrated circuits described above includes dual-sided interconnects to reduce the height of the stacked IC. The process may be applied to stacked ICs having identical wafers or heterogeneous wafers with different functions. For example, a stacked IC manufactured using the exemplary process may include an application-specific integrated circuit (ASIC) in the first tier wafer and memory in the second tier wafer. Formation of extended contacts in the wafers costs less than through silicon vias (TSV), and the extended contacts may be manufactured at sub-micron sizes reducing parasitic capacitance of the contact. For example, the extended contacts may be 50-100 nanometers in diameter at 45-65 nanometer process nodes.

Another advantage of the dual-sided integrated circuits is the placement of BEOL layers on the front and back side of the wafer. Two sets of BEOL layers allow improved wiring efficiency in comparison to a single set of BEOL layers. Additionally, high density tier-to-tier connections are possible at a transistor level or macro level and may include power and ground connections. For example, tier-to-tier connections of $10^4$-$10^5$ connections/square millimeter are possible.

Figure 4:
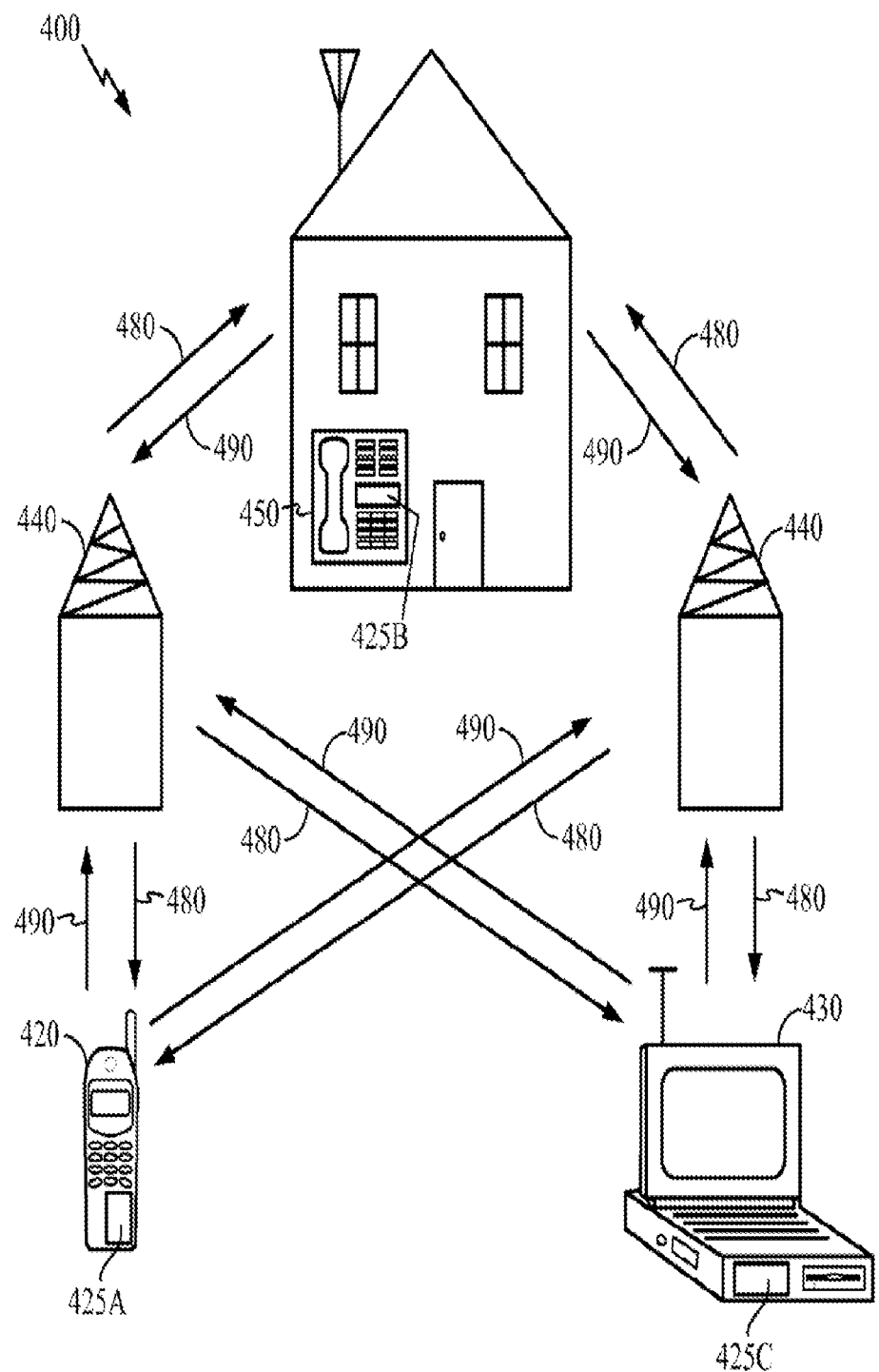
FIG. 4 is a block diagram showing an exemplary wireless communication system in which an embodiment may be advantageously employed.

FIG. 4 shows an exemplary wireless communication system 400 in which an embodiment of the disclosure may be advantageously employed. For purposes of illustration, FIG. 4 shows three remote units 420, 430, and 450 and two base stations 440. It will be recognized that wireless communication systems may have many more remote units and base stations. Remote units 420, 430, and 450 include stacked ICs 425A, 425C, and 425B, respectively, which are embodiments as discussed above. FIG. 4 shows forward link signals 480 from the base stations 440 and the remote units 420, 430, and 450 and reverse link signals 490 from the remote units 420, 430, and 450 to base stations 440.

In FIG. 4, remote unit 420 is shown as a mobile telephone, remote unit 430 is shown as a portable computer, and remote unit 450 is shown as a computer in a wireless local loop system. For example, the remote units may be cell phones, mobile phones, computers, set top boxes, music players, video players, entertainment units, hand-held personal communication systems (PCS) units, portable data units such as personal data assistants, or fixed location data units such as meter reading equipment. Although FIG. 4 illustrates remote units according to the teachings of the disclosure, the disclosure is not limited to these exemplary illustrated units. The disclosure may be suitably employed in any device, which includes stacked ICs.

Figure 5:
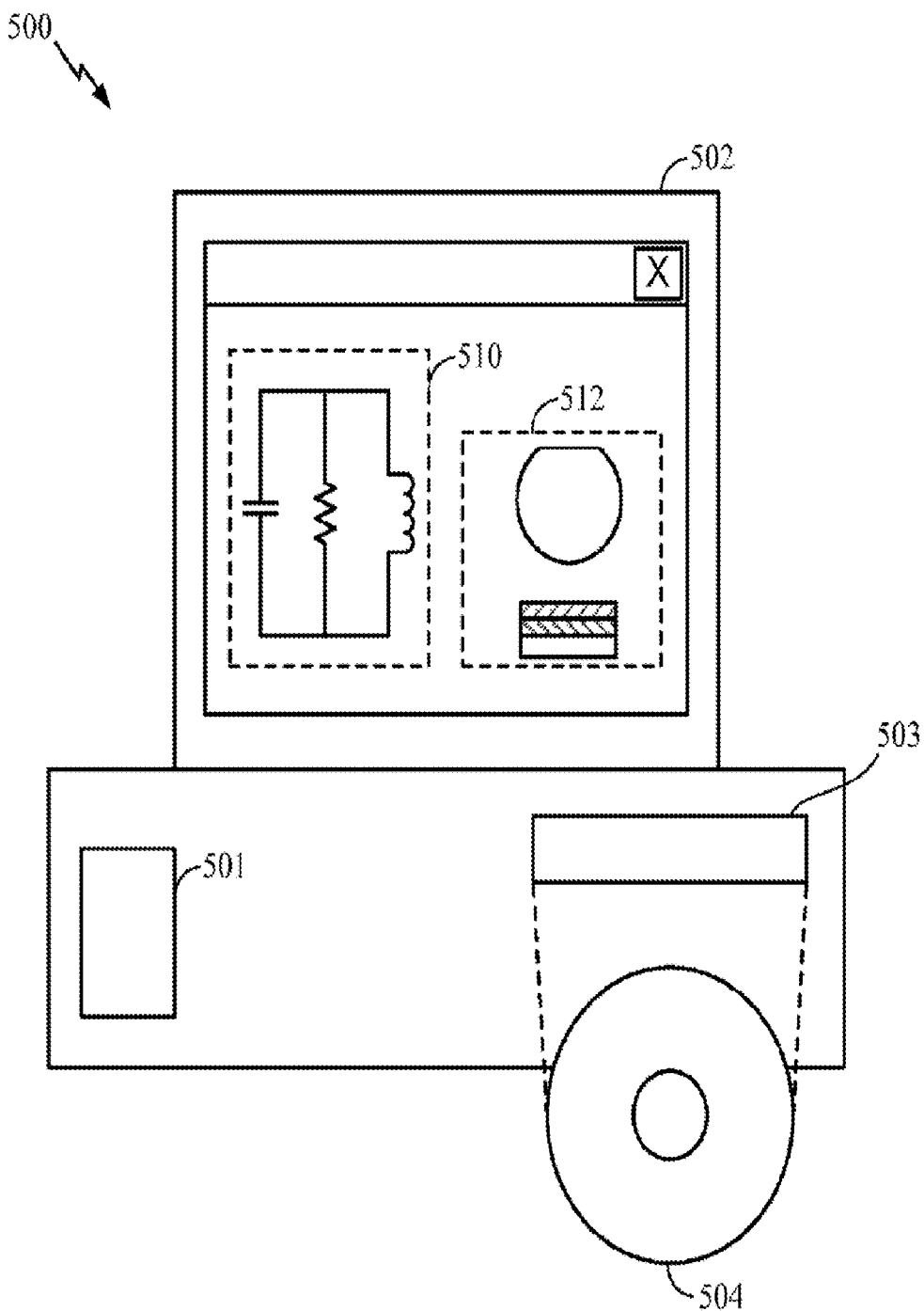
FIG. 5 is a block diagram illustrating a design workstation used for circuit, layout, and logic design of a semiconductor component according to one embodiment.

FIG. 5 is a block diagram illustrating a design workstation used for circuit, layout, and logic design of a semiconductor component as disclosed below. A design workstation 500 includes a hard disk 501 containing operating system software, support files, and design software such as Cadence or OrCAD. The design workstation 500 also includes a display to facilitate design of a circuit 510 or a semiconductor component 512 such as a wafer or die. A storage medium 504 is provided for tangibly storing the circuit design 510 or the semiconductor component 512. The circuit design 510 or the semiconductor component 512 may be stored on the storage medium 504 in a file format such as GDSII or GERBER. The storage medium 504 may be a CD-ROM, DVD, hard disk, flash memory, or other appropriate device. Furthermore, the design workstation 500 includes a drive apparatus 503 for accepting input from or writing output to the storage medium 504.

Data recorded on the storage medium 504 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 504 facilitates the design of the circuit design 510 or the semiconductor component 512 by decreasing the number of processes for designing semiconductor wafers.

The methodologies described herein may be implemented by various components depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the terminology "through silicon via" includes the word silicon, it is noted that through silicon vias are not necessarily constructed in silicon. Rather, the material can be any device substrate material.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a stacked integrated circuit, comprising:
    coupling a first back-end-of-line layer comprising a conductive layer to a contact point on a surface of a first tier by a via, the first back-end-of-line layer on a first side of the first tier and the contact on a second side of the first tier opposite the first side; and
    extending a first contact through a source region or a drain region in the first tier the first contact coupled between the conductive layer and the contact point and configured to provide an electrical path through the first tier.

2. The method of claim 1, further comprising:
    thinning the first tier at the second side of the first tier to expose the first contact.

3. The method of claim 2, in which thinning the first tier comprises recess etching the first tier.

4. The method of claim 1, further comprising:
    depositing a dielectric on the second side of the first tier after thinning the first tier.

5. The method of claim 4, in which depositing the dielectric on the first tier comprises:
    conformally depositing the dielectric on the first tier; and
    performing chemical mechanical polishing to the dielectric.

6. The method of claim 4, further comprising:
    depositing a second back-end-of-the-line layer on the dielectric, the second back-end-of-the-line layer coupled to the first contact.

7. The method of claim 6, further comprising:
    bonding a second tier wafer to the first tier after depositing the second back-end-of-the-line layer so that circuitry on the second tier wafer is coupled to the first back-end-of-the-line layer through the first contact.

8. The method of claim 7, further comprising:
    mounting the first tier to a carrier wafer before thinning; and demounting the first tier from the carrier wafer after bonding the second tier wafer.

9. The method of claim 8, further comprising:
    performing front-end-of-the-line processing on the first tier before mounting the first tier to the carrier wafer.

10. The method of claim 8, further comprising:
    thinning the second tier wafer after bonding the second tier wafer to the first tier before demounting the first tier from the carrier wafer.

11. The method of claim 10, in which thinning the second tier wafer exposes a second contact.

12. The method of claim 11, further comprising:
    depositing a third back-end-of-the-line layer on the second tier wafer, the third back-of-the-line layer coupled to the second contact after thinning the second tier wafer; and
    bonding a third tier wafer after depositing the third back-of-the-line layer on the second tier wafer.

13. The method of claim 1, further comprising integrating the stacked integrated circuit into a mobile phone, a set top box, a music player, a video player, an entertainment unit, a navigation device, a computer, a hand-held personal communication systems (PCS) unit, a portable data unit, and/or fixed location data unit.

14. A method of manufacturing an integrated circuit, comprising:
    coupling a first back-end-of-line layer comprising a conductive layer to a contact point on a surface of a first tier by a via, the first back-end-of-line layer on a first side of the first tier and the contact on a second side of the first tier opposite the first side;
    extending a first contact through opposing surfaces of a source region or a drain region in the first tier, the first contact coupled between the conductive layer and the contact point and configured to provide an electrical path through the first tier; and
    forming a first contact pad in contact with the contact point on the second side.

15. The method of claim 14, further comprising attaching a second tier to the first tier.

16. The method of claim 15, wherein the second tier is attached to the first tier through a second contact pad on a first side of the second tier and the first contact pad.

17. A method of manufacturing a stacked integrated circuit, comprising:
    coupling a first back-end-of-line layer comprising a conductive layer to a contact point on a surface of a first tier by a via, the first back-end-of-line layer on a first side of the first tier and the contact on a second side of the first tier opposite the first side; and
    forming a first means for providing an electrical path through the first tier, the first means extending through opposing surfaces of a source region or a drain region in the first tier, the first means coupled between the conductive layer and the contact point.

18. The method of claim 17, further comprising attaching a second tier to the first tier.

19. The method of claim 17, further comprising coupling a second back-end-of-line layer to the first contact.

20. The method of claim 17, further comprising integrating the stacked integrated circuit into a mobile phone, a set top box, a music player, a video player, an entertainment unit, a navigation device, a computer, a hand-held personal communication systems (PCS) unit, a portable data unit, and/or fixed location data unit.

\* \* \* \* \*